United States Patent
Ishima

(10) Patent No.: US 11,862,437 B2
(45) Date of Patent: Jan. 2, 2024

(54) EDGE RING AND PLASMA PROCESSING APPARATUS

(71) Applicant: Kioxia Corporation, Tokyo (JP)

(72) Inventor: Yasuhisa Ishima, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 431 days.

(21) Appl. No.: 17/017,487

(22) Filed: Sep. 10, 2020

(65) Prior Publication Data

US 2021/0296096 A1 Sep. 23, 2021

(30) Foreign Application Priority Data

Mar. 18, 2020 (JP) ................................. 2020-047330

(51) Int. Cl.
*H01J 37/32* (2006.01)
*H01L 21/687* (2006.01)

(52) U.S. Cl.
CPC .. *H01J 37/32642* (2013.01); *H01J 37/32715* (2013.01); *H01L 21/68735* (2013.01)

(58) Field of Classification Search
CPC .......... H01J 37/32642; H01J 37/32715; H01L 21/68735
USPC .................................................... 156/345.54
See application file for complete search history.

(56) References Cited

U.S. PATENT DOCUMENTS

| | | | |
|---|---|---|---|
| 8,298,371 B2 | 10/2012 | Koshimizu et al. | |
| 2012/0175063 A1* | 7/2012 | Yamawaku | H01L 21/67069 156/345.46 |
| 2013/0008609 A1 | 1/2013 | Koshimizu et al. | |
| 2016/0211166 A1* | 7/2016 | Yan | H01L 21/68735 |
| 2017/0213758 A1* | 7/2017 | Rice | H01J 37/32082 |
| 2018/0277416 A1* | 9/2018 | Takahashi | H01L 21/6831 |
| 2018/0294137 A1 | 10/2018 | Koshimizu et al. | |
| 2019/0326092 A1 | 10/2019 | Ogasawara et al. | |
| 2019/0333785 A1 | 10/2019 | Tanikawa | |
| 2020/0234981 A1* | 7/2020 | Schmid | H01L 21/67063 |
| 2020/0303233 A1* | 9/2020 | Lee | H01L 21/67778 |
| 2021/0066052 A1* | 3/2021 | Emura | H01L 21/68742 |
| 2021/0098238 A1* | 4/2021 | Hayashi | H01L 21/68735 |
| 2021/0111007 A1* | 4/2021 | Kim | H01L 21/67069 |
| 2021/0280396 A1* | 9/2021 | Matsuura | H01L 21/68735 |
| 2022/0013339 A1* | 1/2022 | Dogome | H01L 21/6833 |

FOREIGN PATENT DOCUMENTS

| | | |
|---|---|---|
| JP | 2008-244274 A | 10/2008 |
| JP | 2019-192734 A | 10/2019 |
| JP | 2019-192881 A | 10/2019 |

* cited by examiner

*Primary Examiner* — Charlee J. C. Bennett
(74) *Attorney, Agent, or Firm* — Oblon, McClelland, Maier & Neustadt, L.L.P.

(57) ABSTRACT

According to one embodiment, an edge ring is provided which includes a first movable portion provided along an outer circumference of a support portion having an upper surface capable of holding a semiconductor substrate thereon, the first movable portion being movable in a direction perpendicular to the upper surface; a second movable portion provided along an outer circumference of the first movable portion, the second movable portion being movable in the direction; and a driving portion capable of moving the first movable portion in the direction by way of the second movable portion.

8 Claims, 6 Drawing Sheets

EDGE RING AND PLASMA PROCESSING APPARATUS

CROSS-REFERENCE TO RELATED APPLICATIONS

This application is based upon and claims the benefit of priority from Japanese Patent Application No. 2020-047330, filed on Mar. 18, 2020; the entire contents of which are incorporated herein by reference.

FIELD

Embodiments With this disclosure relate to an edge ring and a plasma processing apparatus.

BACKGROUND

A chamber of a plasma processing apparatus may be provided with an edge ring along an outer circumference of a support table that supports a semiconductor substrate. The edge ring is provided vertically movable with respect to the support table. By adjusting a height of the edge ring, plasma generated over the support table can be controlled to be uniform.

DETAILED DESCRIPTION

Figure 1:
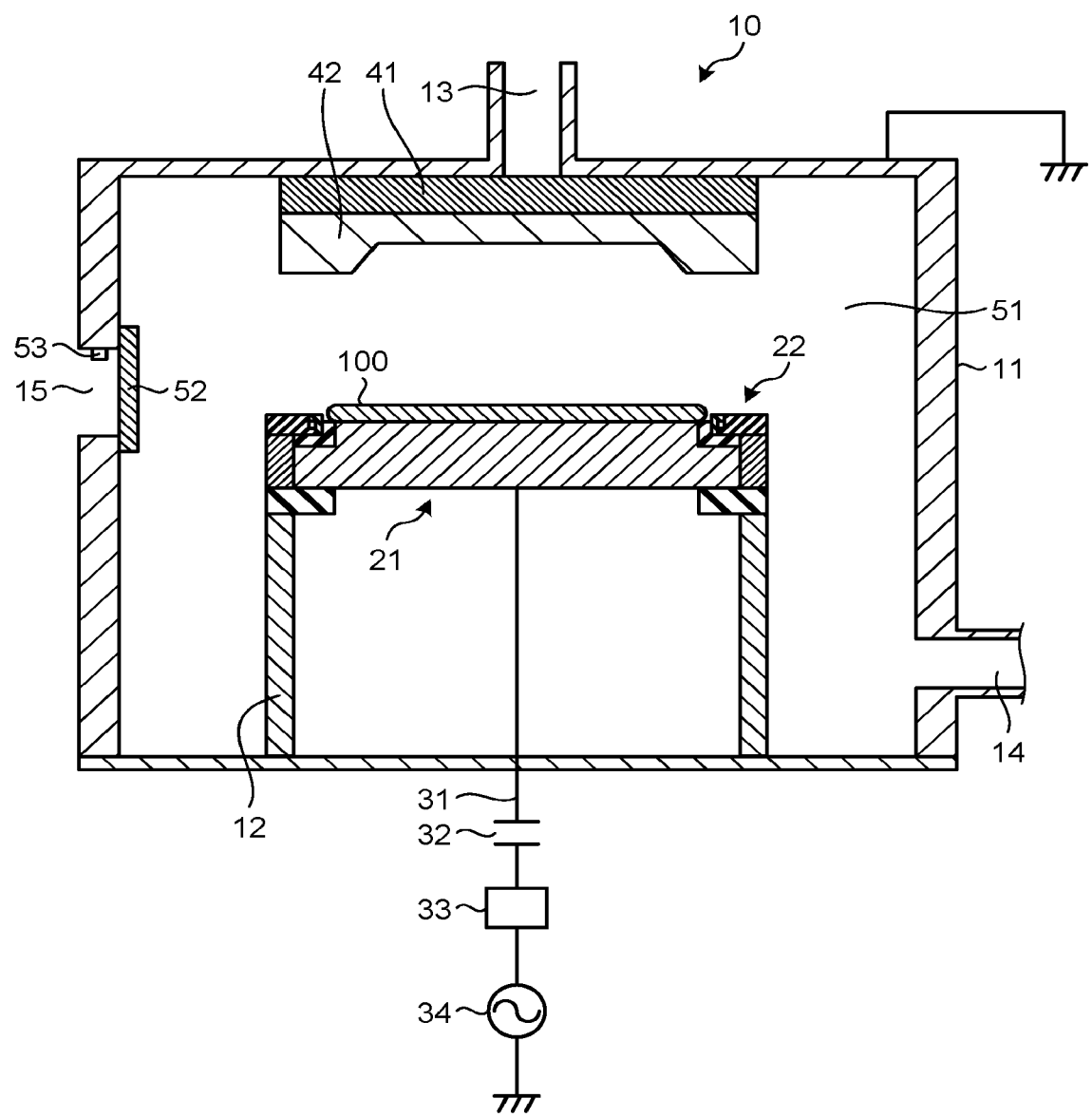
FIG. 1 is a view schematically illustrating a structure of a plasma processing apparatus according to an embodiment.

When an edge ring is raised excessively and thus a lower surface thereof becomes higher than an upper surface of a support table, a gap is generated between the edge ring and the support table. Then, plasma enters below the edge ring through the gap, and thus an arc discharge may occur. In order to prevent this, the edge ring needs to be vertically moved as far as the lower surface is not beyond the upper surface of the support table. Therefore, there may be a case where the plasma cannot be more uniformed by restriction of a height of the edge ring, even if the plasma can be more uniformed by raising the edge ring.

One embodiment of the present invention provides an edge ring that is provided along an outer circumference of a support table for supporting a substrate, and is capable of increasing a vertically movable range.

According to one embodiment of this disclosure, an edge ring is provided which includes a first movable portion provided along an outer circumference of a support portion having an upper surface capable of holding a semiconductor substrate thereon, the first movable portion being movable in a direction perpendicular to the upper surface; a second movable portion provided along an outer circumference of the first movable portion, the second movable portion being movable in the direction; and a driving portion capable of moving the first movable portion in the direction by way of the second movable portion.

Non-limiting, exemplary embodiments of the present disclosure will now be described with reference to the accompanying drawings. In the drawings, the same or corresponding reference marks are given to the same or corresponding members or components, and redundant explanations will be omitted. It is to be noted that the drawings are illustrative of the disclosure, and there is no intention to indicate scale or relative proportions among the members or components. Therefore, the specific size should be determined by a person having ordinary skill in the art in view of the following non-limiting embodiments.

FIG. 1 is a view schematically illustrating a structure of a plasma processing apparatus according to one embodiment. As illustrated, a plasma processing apparatus 10 has a chamber 11, which is provided with a gas supplying port 13 through which a process gas to be used in a plasma process is supplied and a gas exhausting port 14 through which the process gas is exhausted. A process gas-supplying source (not illustrated) is connected to the gas supplying port 13 through a predetermined pipe, and an exhausting apparatus (not illustrated) such as a vacuum pump is connected to gas exhausting port 14. Additionally, the chamber 11 is formed of metal such as aluminum or alloys such as stainless steel. The chamber 11 is grounded.

A support plate 21 is provided inside the chamber 11. The support plate 21 may have an electrostatic chuck. With this, a substrate 100, which is a target of the plasma processing, can be held on the upper surface of the support plate 21.

The support plate 21 is fixed to be located at substantially the center in the chamber 11 by a support member 12. Additionally, an edge ring 22 is provided along an outer circumferential surface of the support plate 21. The edge ring 22 is provided to adjust an electric field so that the electric field is not deflect in an outer circumference of the substrate 100 with respect to a vertical direction (a direction perpendicular to the upper surface of the substrate to be processed). Explanation is made later about structures of the support plate 21 and the edge ring 22.

Additionally, an electricity supply line 31 that supplies a high frequency power electricity is connected to the support plate 21. The electricity supply line 31 has a blocking capacitor 32, a matching box 33, and a high frequency power source 34 connected thereto. High frequency power of predetermined frequency is supplied to the support plate 21 from the high frequency power source 34. Namely, the support plate 21 also functions as a bottom electrode.

Above the support plate 21, an upper electrode 42 is provided to be faced with the support plate 21. The upper electrode 42 is fixed to a member 41 provided on a top plate in the chamber 11 with a predetermined distance away from the support plate 21 so as to face parallel to the support plate 21. By such a structure, the upper electrode 42 and the support plate 21 constitutes a pair of parallel plate electrodes. The upper electrode 42 has, for example, a disk shape. The upper electrode 42 is an electrode formed of, for example, silicon. Note that, the upper electrode 42 and member 41 are provided with multiple gas feed paths (not illustrated) that penetrate therethrough in a thickness direction. With this, the process gas is introduced inside the chamber 11 from gas supplying port 13 through the gas feed paths.

An opening 15, which allows the substrate 100 to be transferred into or out from the chamber 11, is provided on a side surface of the chamber 11. The opening 15 has a shutter 52 provided therein. The shutter 52 functions to partition an interior of the chamber 11 from the outside. When the substrate 100 is transferred in and out, the shutter 52 is opened to allow the opening 15 and the chamber 11 to be in communication with each other. In the opening 15, a sensor 53 is provided which detects a position of a carrier arm of the substrate 100 conveyed into and out from the chamber 11 by the carrier arm (not illustrated). The sensor 53 may be, for example, a range sensor. Additionally, although not illustrated in FIG. 1, an elevator 23 is provided on a bottom surface of the chamber 11. The elevator 23 is described later.

Figure 2:
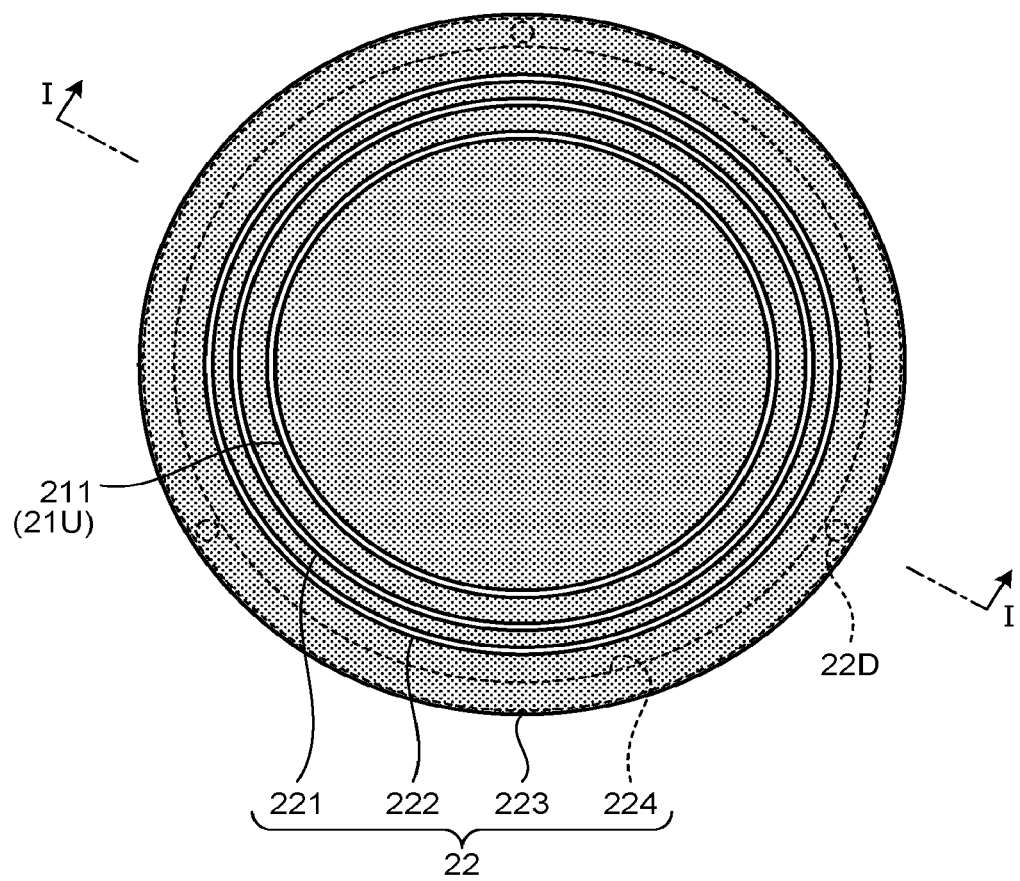
FIG. 2 is a top plan view schematically illustrating a support plate and an edge ring according to an embodiment that are applicable to the plasma processing apparatus of FIG. 1.
Figure 3:
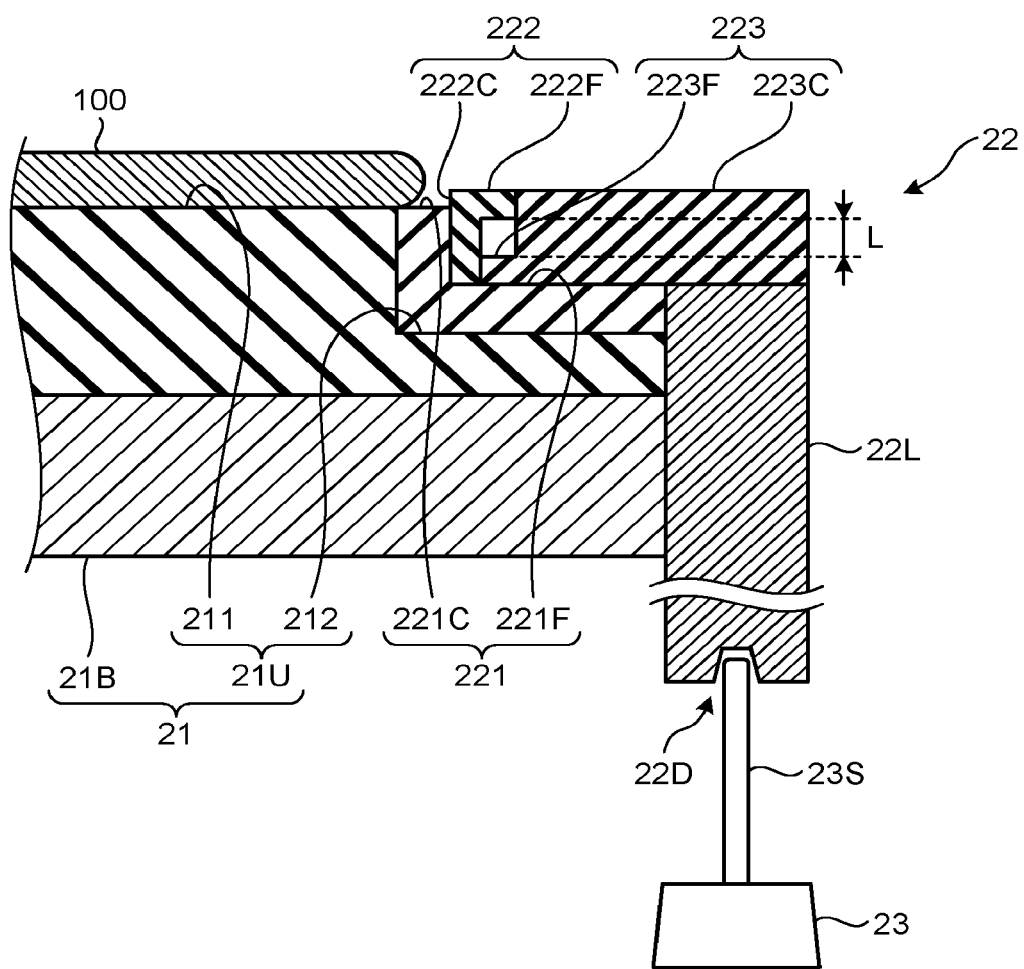
FIG. 3 is an enlarged view schematically illustrating a cross section of the support plate and the edge ring that are illustrated in FIG. 2.

Referring now to FIGS. 2 and 3, explanations are made on the support plate 21 and the edge ring 22. FIG. 2 is a top plan view illustrating the support plate 21 and the edge ring 22; and FIG. 3 is a cross-sectional partially enlarged view taken along a I-I line of FIG. 2.

A small-diameter portion 211 of an upper plate 21U of the support plate 21 is illustrated in FIG. 2. The small-diameter portion 211 has a circular shape in planar view as illustrated, and serves as a support member supporting the substrate 100 thereon. The small-diameter portion 211 has, for example but not limited to, a slightly larger diameter than a diameter of the substrate 100 as illustrated in FIG. 3. Therefore, an outer circumferential portion (for example, a bevel portion) of the substrate 100 extends outward the small-diameter portion 211 when the substrate 100 is supported by the small-diameter portion 211.

Additionally, as illustrated in FIG. 3, the upper plate 21U has a large-diameter portion 212 concentrically to the small-diameter portion 211 below the small-diameter portion 211. With this, a step is created between the small-diameter portion 211 and the large-diameter portion 212, and the upper surface of the large-diameter portion 212 is exposed. For example, the upper plate 21U having such a shape can be formed of ceramic materials such as $Al_2O_3$ and AlN. Additionally, the upper plate 21U may be provided with an electrostatic chuck that can hold the substrate 100 electrostatically.

The upper plate 21U is fixed on a base 21B by, for example, an adhesive and the like, as illustrated in FIG. 3. The base 21B can be formed of metal such as aluminum or alloys such as stainless steel. Additionally, conduits may be formed within the base 21B. The base 21B can adjust a temperature of the upper plate 21U and then the substrate 100 supported thereon by supplying into the conduits a fluid adjusted to a predetermined temperature.

The edge ring 22 is arranged to surround the support plate 21. The edge ring 22 has a stationary ring 221, an inner movable ring 222 (a first moving part), an outer movable ring 223 (a second moving part), and a lifter 22L (drive). The stationary ring 221, the inner movable ring 222, and the outer movable ring 223 may be formed of, for example, silicon carbide (SiC) and the like. Additionally, the lifter 22L is formed of aluminum (Al), in this embodiment, and the surface thereof is coated with yttria ($Y_2O_3$). With this coating, the lifter 22L can be protected by charged particles and the like within plasma produced in the chamber 11.

The stationary ring 221 is composed of a cylindrical portion 221C and a flange portion 221F extending outward from a bottom end of the cylindrical portion 221C. With this, the stationary ring 221 has a ring shape in planar view, and an L-shaped cross-section. The stationary ring 221 is arranged concentrically to the small-diameter portion 211 of the upper plate 21U so that an inner circumferential surface of the cylindrical portion 221C faces an outer circumferential surface of the small-diameter portion 211 of the upper plate 21U. Additionally, the flange portion 221F of the stationary ring 221 is placed on the large-diameter portion 212 of the upper plate 21U. The upper surface of the cylindrical portion 221C is lower than the upper surface of the small-diameter portion 211 of the upper plate 21U in order not to touch the substrate 100 supported by the upper plate 21U. The flange portion 221F has a size that does not extend diametrically beyond the large-diameter portion 212 of the upper plate 21U.

The inner movable ring 222 is composed of a cylindrical portion 222C and a flange portion 222F extending outward from the upper end of the cylindrical portion 222C. With this, the inner movable ring 222 has a ring shape in planar view, and an L-shaped cross-section. The inner movable ring 222 is arranged so that the cylindrical portion 222C is placed on the flange portion 221F of the stationary ring 221 in between the cylindrical portion 221C of the stationary ring 221 and the outer movable ring 223. Therefore, the inner movable ring 222 is arranged concentrically to the stationary ring 221 and the cylindrical portion 221C of the small-diameter portion 211 of the upper plate 21U. Additionally, a height of the inner movable ring 222 is approximately equal to a height of the outer movable ring 223. Therefore, the upper surface of the inner movable ring 222 is flush with the upper surface of the outer movable ring 223, when the inner movable ring 222 and the outer movable ring 223 are placed on the flange portion 221F of the stationary ring 221.

The outer movable ring 223 is composed of a disk portion 223C and a flange portion 223F extending inward from the bottom end of the disk portion 223C. The outer movable ring 223 is placed on the upper surface of the flange portion 221F of the stationary ring 221 and is supported by the lifter 22L. With this, the outer movable ring 223 is arranged concentrically to the upper plate 21U, the stationary ring 221 and the inner movable ring 222. Additionally, the flange portion 223F of the outer movable ring 223 is located below the flange portion 222F of the inner movable ring 222. Here, as illustrated in FIG. 3, the upper surface of the flange portion 223F of the outer movable ring 223 and the lower surface of the flange portion 222F of the inner movable ring 222 are kept away with each other only by a distance L The lifter 221L, which has a cylinder shape with an inner surface 224, is placed to surround the outside of the support plate 21 and the stationary ring 221. Additionally, as illustrated in FIG. 3, the lifter 22L supports on an upper surface thereof the outer movable ring 223. Moreover, for example, three recesses 22D are formed (FIG. 2) in a reverse surface of the lifter 22L, and shafts 23S of an elevator 23 are inserted into corresponding recesses 22D, as illustrated in FIG. 3. The lifter 22L and the outer movable ring 223 can be moved upward and downward by the elevator 23 vertically moving the shafts 23S.

Figure 4:
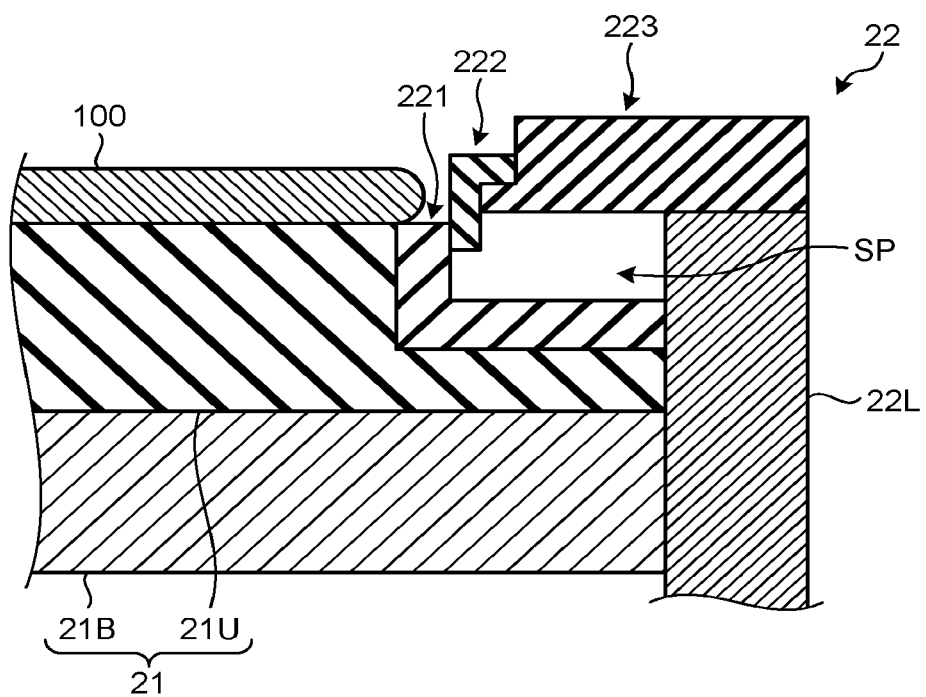
FIG. 4 is another enlarged view schematically illustrating a cross section of the support plate and the edge ring that are illustrate in FIG. 2.

With the above-mentioned structure, when the elevator 23 raises the shafts 23S, the lifter 22L is lifted by the shafts 23S, and thus the outer movable ring 223 is moved upward. When the flange portion 223F of the outer movable ring 223 comes to contact the flange portion 222F of the inner movable ring 222 along with the upward movement of the outer movable ring 223, the inner movable ring 222 is also lifted, as illustrated in FIG. 4. Namely, the inner movable ring 222 is raisable by the elevator 23 by way of the outer movable ring 223. When the inner movable ring 222 is lifted by the outer movable ring 223, the bottom end of the cylindrical portion 222C is located below the lower surface of the outer movable ring 223 only by a distance L.

Here, an upward movement distance of the lifter 22L due to the elevator 23 is restricted so that the bottom end of the inner movable ring 222 is located at the same elevation as the upper end of the stationary ring 221 or lower. With this, a closed space SP is maintained which is surrounded by the stationary ring 221, the inner movable ring 222, the outer movable ring 223, and the lifter 22L.

Figure 5A:
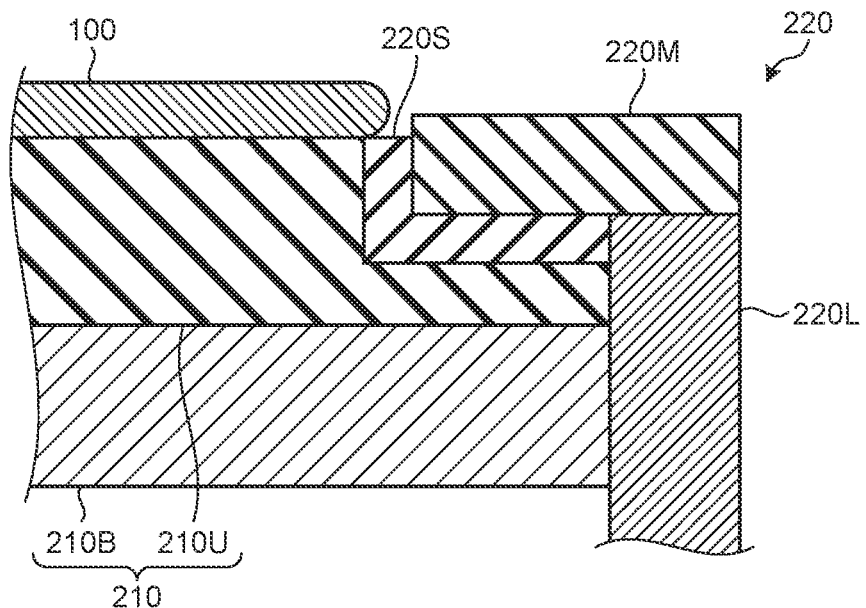
FIGS. 5A and 5B are enlarged views schematically illustrating a cross section of a support plate and an edge ring according to a comparative example.
Figure 5B:
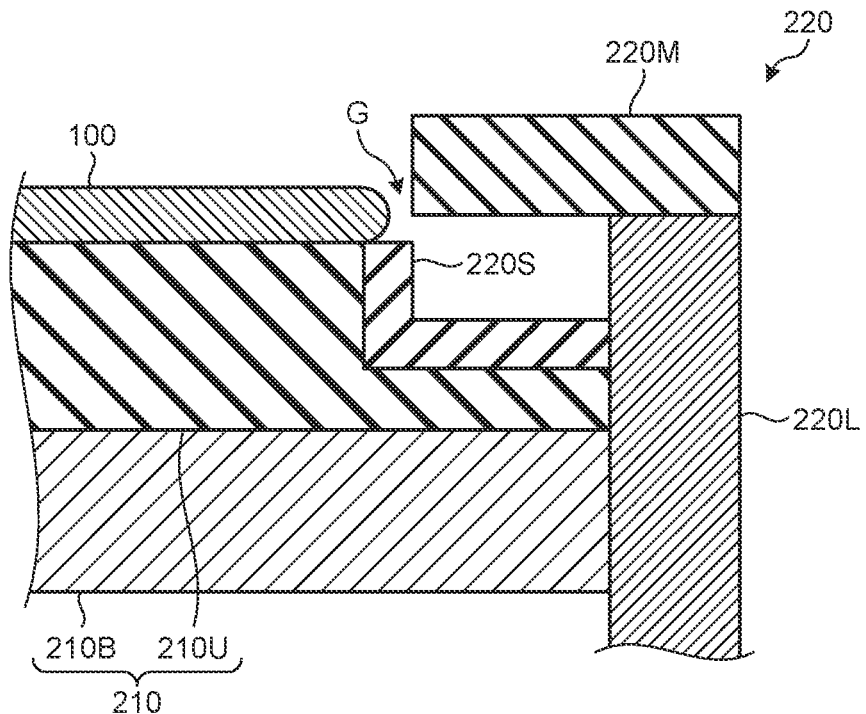

Next, referring to a comparative example, explanation is made on effects exerted by the above-described structure. FIGS. 5A and 5B are partially expanded cross-sectional views illustrating an edge ring 220 according to the comparative example. As illustrated in FIG. 5A, the edge ring 220 according to the comparative example includes a stationary ring 220S, a movable ring 220M, and a lifter 220L, and is arranged at the outer circumference of a support plate 210 composed of an upper plate 210U and a base 210B. Additionally, as clearly understood by comparing FIG. 5A with FIG. 3, the edge ring 220 according to the comparative example does not have a member corresponding to the inner movable ring 222 of for the edge ring 22.

Here, a case is considered where the move movable ring 220M is moved upward by the lifter 220L in order to adjust distribution of plasma produced within the plasma processing chamber (not illustrated) provided with the support plate 210 and the edge ring 220. In this case, a gap G is generated as illustrated in FIG. 5B between the stationary ring 220S and the movable ring 220M when the movable ring 220M is raised. When such a gap G is generated, an arc discharge may occur through the gap G. Additionally, because electric potential around the support plate 210 may change due to the gap G, there may be a situation where plasma distribution to be adjusted by changing a position of the edge ring 22 cannot be realized, and plasma uniformity may be deteriorated.

On the other hand, according to the edge ring 22 of the embodiment, because the closed space SP is maintained even when the outer movable ring 223 is raised as described above, an arc discharge through a gap such as a gap G in the comparative example rarely occurs. Therefore, an effect is exerted where plasma is distributed as intended by moving the outer movable ring 223 in a wider range.

Here, it is assumed that the stationary ring 220S of the edge ring 220 in the comparative example and the stationary ring 221 of the edge ring 22 in the embodiment have the same dimensions; and that the movable ring 220M of the edge ring 220 in the comparative example and the outer movable ring 223 of the edge ring 22 in the embodiment have the same thickness. In this case, a movable range of the outer movable ring 223 is increased by the distance L compared to the movable ring 220M.

Furthermore, when an edge ring is used in a plasma processing apparatus and thus the upper surface thereof is exposed to plasma, the edge ring may be worn. When this happens, the edge ring becomes thinner. As a result, in the edge ring 220 according to the comparative example, for example, a raising distance until the gap G is generated becomes shorter when the movable ring 220M is raised. If the edge ring 220 cannot be raised further in order to avoid an arc discharge and the like through the gap G, a situation may arise where distribution of the plasma cannot be sufficiently adjusted. Therefore, the edge ring 220 needs to be highly frequently replaced, and maintenance costs expenses of the plasma processing apparatus might be increased. Additionally, downtime of the plasma processing apparatus may also be increased by replacing the edge ring 220.

In the edge ring 22 according to the embodiment, because the closed space SP is maintained by the cylindrical portion 222C of the inner movable ring 222 even if the inner movable ring 222 and the outer movable ring 223 are worn, the rising distance (movable range) may be prevented from being decreased. Therefore, the edge ring 22 can be replaced less frequently than the edge ring 220 according to the comparative example. Along with this, maintenance costs and downtime of the plasma processing apparatus are expected to be lower.

Modification

Figure 6A:
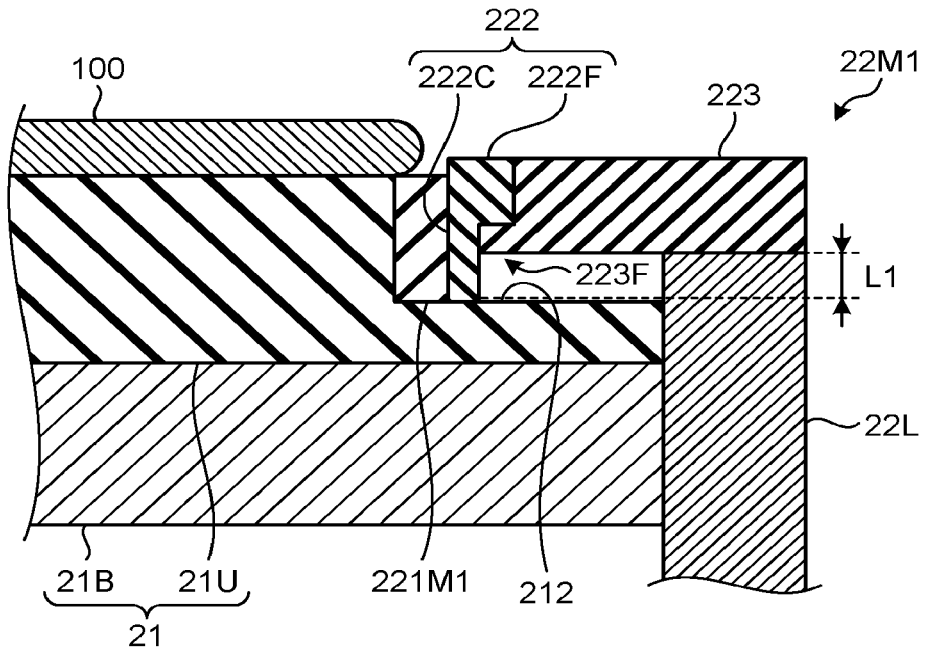
FIGS. 6A and 6B are enlarged views schematically illustrating a part of a support plate and an edge ring according to modification of the embodiment.
Figure 6B:
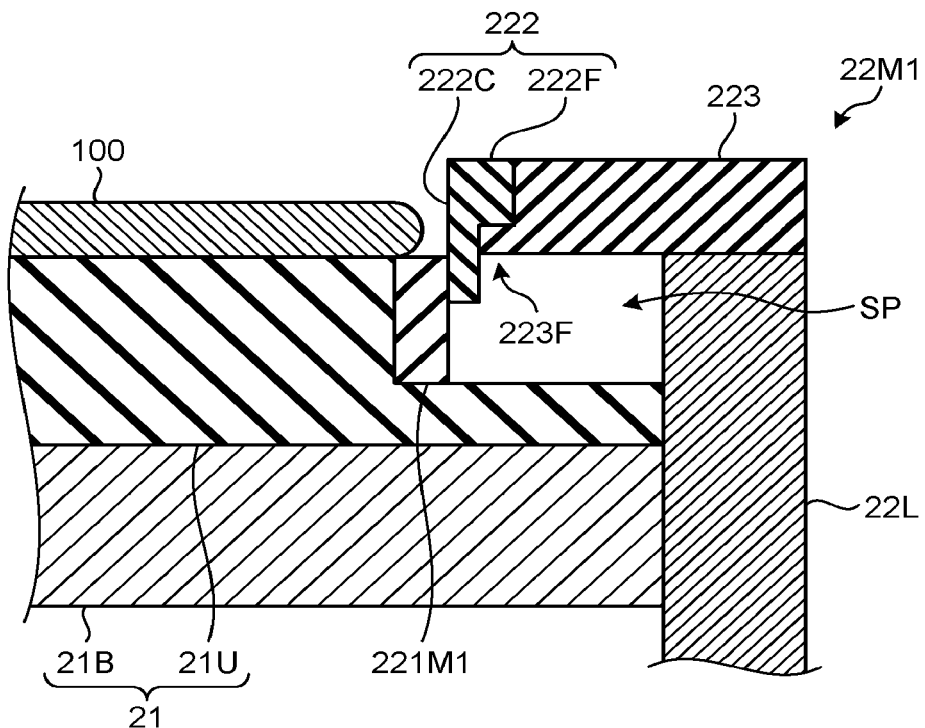

Referring now to FIGS. 6A and 6B, explanation is made on an edge ring according to modification of the embodiment. FIGS. 6A and 6B are partially enlarged views of a support plate and an edge ring according to the modification of the embodiment. In the edge ring according to the modification, shapes of a stationary ring and an inner movable ring are different from the stationary ring 221 and the inner movable ring 222 according to the embodiment, respectively, and other structures are the same. The edge ring according to the modification is described as follows, focusing on the difference.

As illustrated in FIG. 6A, an edge ring 22M1 according to the modification has a stationary ring 221M1. The stationary ring 221M1 has a cylindrical shape and is arranged concentrically with the support plate 21. Namely, the stationary ring 221M1 is different from the stationary ring 221 of the edge ring 22 according to the embodiment in that the stationary ring 221M1 does not have the flange portion 221F. With this, the outer movable ring 223 is supported by the lifter 22L without being placed on the flange portion 221F.

Additionally, the inner movable ring 222 of the edge ring 22M1 has a cylindrical portion 222C and a flange portion 222F. However, a lower surface of the cylindrical portion 222C is in contact with the large-diameter portion 212 of the upper plate 21U. Here, the cylindrical portion 222C of the inner movable ring 222 extends lower than a lower surface of the outer movable ring 223 by a distance L1. Additionally, a lower surface of the flange portion 222F of the inner movable ring 222 is in contact with an upper surface of collar portion 233F of the outer movable ring 223.

According to such a structure, the inner movable ring 222 is lifted along with the upward movement of the outer movable ring 223 by the lifter 22L. Here, an upward moving distance of the lifter 22L by the elevator 23 (FIG. 3) is restricted so that a bottom end of the inner movable ring 222 is at the same level of, or lower, the upper end of the stationary ring 221. With this, as illustrated in FIG. 6B, the closed space SP is maintained which is surrounded by the large-diameter portion 212 of the upper plate 21U, the stationary ring 221M1, the inner movable ring 222, the outer movable ring 223, and the lifter 22L.

Therefore, the effect exerted by the edge ring 22 according to the embodiment is also exerted by the edge ring 22M1 according to the modification. Note that, in the modification, the movable range of the outer movable ring 223 is increased more by the distance L1 than the movable range of the movable ring 220M of the edge ring 220 according to the comparative example.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An edge ring comprising:
    an inner movable ring provided along an outer circumference of a small diameter portion of an upper plate having an upper surface capable of holding a semiconductor substrate thereon, the inner movable ring being movable in a direction perpendicular to the upper surface;
    a stationary ring between the outer circumference of the small diameter portion of the upper plate and an inner circumference of the inner movable ring, the stationary ring being beyond the inner circumference of the inner movable ring and in contact with the small diameter portion of the upper plate;
    an outer movable ring provided along an outer circumference of the inner movable ring, the outer movable ring being movable in the perpendicular direction; and
    a lifter supporting the outer movable ring and moving the outer movable ring in the perpendicular direction, the lifter being capable of moving the inner movable ring in the perpendicular direction by way of the outer movable ring, wherein
    the inner movable ring includes a first flange extending from an upper end of the inner movable ring toward the outer movable ring,
    the outer movable ring includes a second flange extending from a lower end of the outer movable ring toward the inner movable ring, the second flange being disposed below the first flange,
    the outer movable ring is moved by the lifter in the perpendicular direction in a state where the second flange is located below and apart from the first flange, and
    the inner movable ring and the outer movable ring are together moved in the perpendicular direction in a state where the second flange is located below and in contact with the first flange.

2. The edge ring according to claim 1, wherein a closed space is defined by the inner movable ring, the outer movable ring, the lifter, and the stationary ring, when the inner movable ring is moved upward by the lifter by way of the outer movable ring.

3. The edge ring according to claim 1, wherein the stationary ring includes a third flange that extends outward from a lower end of the stationary ring, and the inner movable ring is placed on the third flange.

4. A plasma processing comprising:
    a chamber;
    an upper plate with a small diameter portion having an upper surface capable of holding a semiconductor substrate thereon, the upper plate being arranged within the chamber;
    an electrode to which high-frequency power is to be supplied from a high-frequency power source;
    an edge ring including
    an inner movable ring provided along an outer circumference of the small diameter portion of the upper plate, the inner movable ring being movable in a direction perpendicular to the upper surface of the small diameter portion,
    a stationary ring between the outer circumference of the small diameter portion of the upper plate and an inner circumference of the inner movable ring, the stationary ring being beyond the inner circumference of the inner movable ring and in contact with the small diameter portion of the upper plate,
    an outer movable ring provided along an outer circumference of the inner movable ring, the outer movable ring being movable in the perpendicular direction, and
    a lifter supporting the outer movable ring and moving the outer movable ring in the perpendicular direction, the lifter being capable of moving the inner movable ring in the perpendicular direction by way of the outer movable ring; and
    the inner movable ring includes a first flange extending from an upper end of the inner movable ring toward the outer movable ring,
    the outer movable ring includes a second flange extending from a lower end of the outer movable ring toward the inner movable ring, the second flange being disposed below the first flange,
    the outer movable ring is moved by the lifter in the perpendicular direction in a state where the second flange is located below and apart from the first flange, and
    the inner movable ring and the outer movable ring are together moved in the perpendicular direction in a state where the second flange is located below and in contact with the first flange.

5. The plasma processing apparatus according to claim 4, wherein
    a closed space is defined by the inner movable ring, the outer movable ring, the lifter, and the stationary ring, when the inner movable ring is moved upward by the lifter by way of the outer movable ring.

6. The plasma processing apparatus according to claim 4, wherein
    the stationary ring includes a third flange that extends outward from a lower end of the stationary ring, and
    the inner movable ring is placed on the third flange.

7. The edge ring according to claim 3, wherein the lifter is configured to move in the perpendicular direction in a state where a lower end of the inner movable ring is located at a position lower than an upper end of the stationary ring.

8. The plasma processing apparatus according to claim 6, further comprising an elevator configured to move the lifter in the perpendicular direction in a state where a lower end of the inner movable ring is located at a position lower than an upper end of the stationary ring.

* * * * *